United States Patent [19]
Yagi et al.

[11] Patent Number: 4,787,143
[45] Date of Patent: Nov. 29, 1988

[54] METHOD FOR DETECTING AND CORRECTING FAILURE IN MOUNTING OF ELECTRONIC PARTS ON SUBSTRATE AND APPARATUS THEREFOR

[75] Inventors: Hiroshi Yagi; Masanori Ohta; Hirokazu Shutou; Masami Tsuji, all of Tokyo, Japan

[73] Assignee: TDK Corporation, Tokyo, Japan

[21] Appl. No.: 865,067

[22] Filed: May 19, 1986

[30] Foreign Application Priority Data

Dec. 4, 1985 [JP] Japan .............................. 60-273796
Dec. 16, 1985 [JP] Japan .............................. 60-282366

[51] Int. Cl.⁴ .................... H05K 3/30; B23P 19/00
[52] U.S. Cl. ......................................... 29/833; 29/740; 29/705; 29/710; 29/712; 29/834
[58] Field of Search .............. 29/407, 740, 759, 834, 29/833, 702, 710, 712, 720, 705; 235/375

[56] References Cited

U.S. PATENT DOCUMENTS

| | | | |
|---|---|---|---|
| 2,896,314 | 7/1959 | Godwin et al. | 29/705 X |
| 3,559,279 | 2/1971 | Miklaszewski | 29/740 X |
| 3,581,375 | 6/1971 | Rottmann | 29/740 X |
| 4,222,036 | 9/1980 | Troukens | 29/833 X |
| 4,236,301 | 12/1980 | Hug et al. | 29/740 |
| 4,342,090 | 7/1982 | Caccoma et al. | 29/834 X |
| 4,404,741 | 9/1983 | Lebet et al. | 29/834 X |
| 4,454,413 | 6/1984 | Morton, Jr. | 235/375 |
| 4,526,646 | 7/1985 | Suzuki et al. | 29/740 X |

FOREIGN PATENT DOCUMENTS

| | | | |
|---|---|---|---|
| 59-107202 | 6/1984 | Japan | 29/833 |
| 60-94233 | 5/1985 | Japan | 29/710 |
| 82-02137 | 6/1982 | World Int. Prop. O. | 29/705 |

*Primary Examiner*—Carl J. Arbes
*Attorney, Agent, or Firm*—Frishauf, Holtz, Goodman & Woodward

[57] ABSTRACT

A method and apparatus for detecting and enabling correction of a failure in the mounting of electronic parts on substrates, capable of automatically and efficiently accomplishing the detection of a failure in the mounting of electronic parts on substrates, and classification between failed substrates and acceptable substrates to improve the overall operation efficiency of an electronic parts mounting line. The method is adapted to apply a code mark to each substrate on which electronic parts are to be mounted, detect a failure the mounting after, read and store the code marks and failure data of failed substrates, and classify the failed substrates from acceptable substrates and transfer the failed substrates on the basis of the code marks and failure data stored.

10 Claims, 3 Drawing Sheets

METHOD FOR DETECTING AND CORRECTING FAILURE IN MOUNTING OF ELECTRONIC PARTS ON SUBSTRATE AND APPARATUS THEREFOR

BACKGROUND OF THE INVENTION

1. Field of the Invention

This invention relates to a method for detecting and correcting a failure in the mounting of electronic circuit elements on printed circuit boards and an apparatus therefor, and more particularly to such a method and an apparatus which is adapted to carry out the classification of failed printed circuit boards each having any failure or imperfection faulty of the faulty mounting, misregistration of mounted electronic circuit elements with respect to the printed circuit board, a mistake of the mounting direction, the mounting of incorrect electronic circuit elements thereon or the like, from accepted printed circuit boards, and the transferring of the mounting failed printed circuit boards to a correcting station for correction of the failed printed circuit boards.

2. Description of the Prior Art

In a conventional manufacturing line for mounting electronic circuit elements (hereinafter referred to as "electronic parts" or "chips") on a printed circuit board or assembly board (hereinafter referred to as "substrate"), the correction of defective substrate (defined as a substrate having any imperfection or defect in the mounting of electronic parts thereon) is carried out in a manner such that a checker is operated to detect any mounting failure or imperfection in the mounting of the chips on the substrate upon each mounting of each chip thereon or after the mounting of all required chips thereon, and when it detects any mounting failure or imperfection, the defective substrate is removed from the line and collected in a chip receiver by human work. The so-collected defective substrate is then subjected to correcting operations at a separate correction station.

As can be seen from the foregoing, in the conventional mounting failure correcting system, the removing of a defective substrate from the manufacturing line must be manually carried out and it is required that an operator makes a mark at every failed portion of each defective substrate, so that the correction operation is highly troublesome and inefficient. Also, a failure in the mounting includes failure to mount any component, misregistration of mounted electronic parts with respect to a substrate, a mistake in the mounting direction, the mounting of incorrect electronic parts thereon and the like. However, it is highly inefficient to check or determine mounting imperfections of such various types by means of a single checker.

Also, as is apparent from the foregoing, in the conventional mounting failure correcting system, the checking of the mounting imperfection is carried out every substrate. This fails to improve the overall operation efficiency in the manufacturing line, even when the mounting of electronic parts on substrates is efficiently and continuously performed at a chip mounting station.

Further, the checking of the mounting failure is carried out by applying a fluorescent substance to portions of a substrate on which electronic parts are to be mounted and evaluating the radiating condition of the fluorescent substrate. Unfortunately, such procedure fail to precisely check the mounting failure.

SUMMARY OF THE INVENTION

The present invention has been made in view of the foregoing disadvantage of the prior art.

Accordingly, it is an object of the present invention to provide a method for detecting and correcting a failure in the mounting of electronic parts on substrates which is capable of automatically and efficiently carrying out the classification between defective substrates and nondefective ones, and efficiently and concentratively allowing the defective substrates to be corrected efficiently.

It is another object of the present invention to provide an apparatus for detecting and correcting a failure in the mounting of electronic parts on substrates which is capable of automatically and efficiently carrying out the classification between defective substrates and nondefective ones, and efficiently and concentratively allowing the defective substrates to be corrected efficiently.

It is a further object of the present invention to provide a method for detecting and correcting a failure in the mounting of electronic parts on substrates which is capable of concurrently checking a plurality of chip mounted substrates and correcting a plurality of defective substrates.

It is still another object of the present invention to provide an apparatus for detecting and correcting a failure in the mounting of electronic parts on substrates which is capable of concurrently checking a plurality of chip mounted substrates and correcting a plurality of defective substrates.

It is a still further object of the present invention to provide a method of detecting a failure in the mounting of electronic parts on substrates which is capable of precisely and readily checking the mounting of electronic parts on each of substrates depending upon the configuration of electronic parts.

In accordance with one aspect of the present invention, a method for detecting and correcting a failure in the mounting of electronic parts on substrates is provided which comprises the steps of applying a code mark, by labeling, printing or the like, to a surface of each of each substrate on which electronic parts are to be mounted ; detecting a failure in the mounting of the electronic parts on each of the substrates after the such reading the code mark of each of mounting failed substrate (hereafter "mounting failed substrate"); and classifying the failed substrates from acceptable substrates and transferring the failed substrates to a subsequent correcting step. The code mark may be formed by means of a bar code.

In accordance with the present invention, there is also provided a method for detecting and correcting a failure in the mounting of electronic parts on substrates which comprises the steps of applying a code mark, by labeling, printing or the like, to a surface of each substrate on which electronic parts are to be mounted; detecting a failure in the mounting of the electronic parts on each of the substrates after the mounting, reading the code mark of each failed substrate, and storing code mark data of the corresponding mounting failed substrates together with the detected mounting failure data; classifying the mounting failed substrates from acceptable substrates and transferring the mounting failed substrates to a subsequent correcting station on the basis of the stored code mark data and mounting failure data; and indicating the details of mounting failure of each of the mounting failed substrates to facilitate correcting operation of the mounting failed substrate at the correcting station.

In accordance with another aspect of the present invention, an apparatus for detecting and correcting a failure in the mounting of electronic parts on substrates is provided which comprises a characteristic checker for detecting defective substrates on which electronic parts having characteristics other than predetermined ones are mounted; a misregistration checker for detecting failure to maintain any component, the positional deflection of the mounted electronic parts with respect to each of the substrates, and a mistake of the mounting direction; a separating conveyor for carrying out the classification between the defective substrates and acceptable substrates and transferring the defective substrates to a correcting station; a failure indicator for indicating the details of failure of each of the defective substrates to facilitate the correction of the defective substrate; a code reader incorporated in each of the characteristic checker, misregistration checker, separating conveyor and failure indicator to read a code mark attached to each of the substrates; control boxes connected to the characteristic checker, misregistration checker and separating conveyor, respectively; and a mounting failure data edit controller connected through the control boxes to the characteristic checker, misregistration checker and separating conveyor, respectively, and further connected to the failure indicator; the mounting failure data edit controller editing and storing mounting failure data of the mounting failed substrates supplied from the respective checkers through the corresponding control boxes together with code mark data of the corresponding mounting failed substrates read by the code reader of each of the characteristic checker and misregistration checker; the mounting failure data edit controller carrying out the collating between the code mark data stored therein and code mark data read by the code reader of the separating conveyor to identify the defective substrates, so that the separating conveyor may carry out the classification; the failure indicator selectively calling the mounting failure data stored in the mounting failure data edit controller therefrom depending upon the code mark of each of the defective substrates which is read by the code reader of the failure indicator to indicate the details of the called mounting failure data.

Further, in accordance with the present invention, there is provided a method for detecting and correcting a failure in the mounting of electronic parts on substrates, comprising the steps of arranging a plurality of substrates each having electronic parts thereon in rows; observing images of the electronic parts; successively checking the images of the electronic parts observed and producing check data of the substrates; processing and storing the check data every code mark attached to the substrates; and carrying out the correction of defective substrates on the basis of the stored check data.

In accordance with the present invention, there is also provided an apparatus for detecting and correcting a failure in the mounting of electronic parts on substrates which comprises an X-Y table for arranging in rows a plurality of substrates each having electronic parts mounted thereon; a plurality of checking cameras arranged above the X-Y table at positions corresponding to the positions at which the substrates are arranged; a vision checker for successively checking images of the electronic parts supplied from the checking cameras to generate check data; and a data edit controller for processing and storing the check data every code mark attached to each of the substrates to carry out the correction of defective substrates on the basis of the check data stored therein.

Furthermore, in accordance with a further aspect of the present invention, a method for detecting a failure of the mounting of electronic parts on substrates is provided which comprises the steps of downwardly irradiating light to a substrate having electronic parts mounted thereon to form a shade about the electronic parts; partially demarcating an image of the electronic parts and the shade at a plurality of points along the periphery of the electronic parts; and observing the contrast of the partially demarcated image with the shade to detect a failure in the mounting of the electronic parts on the substrate.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein.

DETAILED DESCRIPTION OF THE PREFERRED EMBODIMENTS

Now, a method for detecting and correcting a failure in the mounting of electronic parts on a substrate and an apparatus therefor according to the present invention will be described hereinafter with reference to the accompanying drawings.

Figure 1:
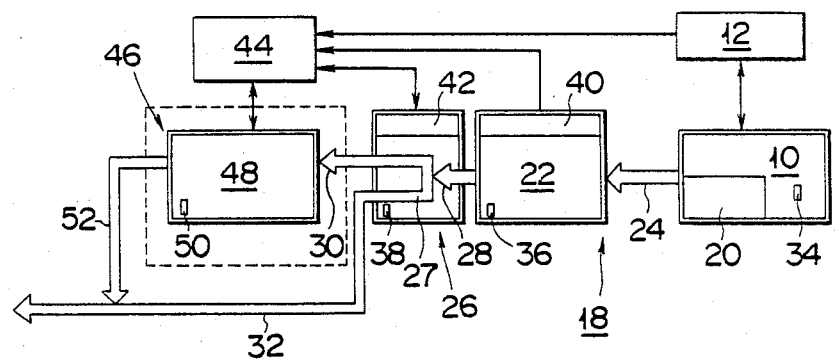
FIG. 1 is a circuit block diagram and a product flow diagram showing an embodiment of a system for detecting and correcting a failure in the mounting of electronic parts on substrates according to the present invention.

FIG. 1 shows an embodiment of a system for detecting and correcting a failure in the mounting of electronic parts on substrates. In the illustrated embodiment, a chip mounting apparatus designated by reference numeral 10 is adapted to successively accomplish the mounting of electronic parts or chips on substrates in response to a predetermined command supplied from a control box 12.

Figure 2:
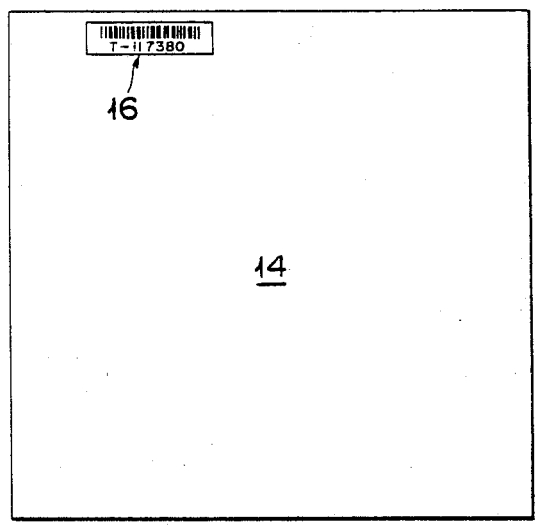
FIG. 2 is a plan view showing an example of a substrate suitable for use in the present invention.

An example of a substrate which is suitable for use in the embodiment is indicated by reference numeral 14 in FIG. 2. The substrate 14 is provided thereon with a code mark 16. The code mark 16 may be formed by adhering a bar code label to the substrate. Alternatively, it may be formed by printing a bar code on the substrate. The printing may be magnetic printing. The so-formed code mark 16 is used to carry out the management of the substrate 14, as described hereinafter.

The mounting failure detecting and correcting system of the illustrated embodiment includes a mechanism for detecting a failure in the mounting of electronic parts on the substrate 14, which is generally designated by reference numeral 18. The mounting failure detecting mechanism 18 includes a characteristic checker 20. In the illustrated embodiment, the characteristic checker 20 is incorporated in the chip mounting apparatus 10 and serves to automatically detect the characteristic mounting failure of the substrate 14 such as the mounting of incorrect electronic parts on the substrate, the mounting of electronic parts having characteristics other than predetermined ones thereon, and the like. As is well known, however, the checker 20 may be arranged separately of the mounting apparatus and include circuitry which operates independently of the mounting apparatus. The mounting failure detecting mechanism 18 also includes a misregistration checker 22 arranged rearwardly of the characteristic checker 20 to detect the misalignment of mounted electronic parts with respect to predetermined positions of the substrate 14, failure to mount any component, a mistake of the mounting direction, and the like. The misregistration checker 22 is connected to the characteristic checker 20 by means of a conveyor 24. Thus, it will be noted that the mounting failure detecting mechanism 18 can check the mounting of electronic parts on the substrate 14 from widely different angles.

The system of the illustrated embodiment also includes a mechanism of classifying, or separating, defective substrates from acceptable or nondefective substrates, which is generally designated by reference numeral 26. In the illustrated embodiment, the classifying mechanism 26 comprises a separating conveyor 27, which is connected to the misregistration checker 22 by means of a conveyor 28. The separating conveyor 27 is separated into a defective substrate conveyor 30 and a nondefective substrate conveyor 32. The defective substrate conveyor 30 is connected to a correcting station or mechanism described hereinafter.

The chip mounting apparatus having the characteristic checker 20 incorporated therein and misregistration checker 22 of the mounting failure detecting mechanism 18 and the classifying mechanism 26 described above have code readers 34, 36 and 38 incorporated therein, respectively, each of which serves to read the code mark 16 applied to the surface of each of the substrates 14. Also, the characteristic checker 20, misregistration checker 22 and classifying mechanism 26 are connected to the control box 12 and control boxes 40 and 42, respectively, which are then connected to a common mounting failure data edit controller 44. The characteristic checker 20 is adapted to detect the above-mentioned failure in the mounting of electronic parts on the substrate 14 and then generate mounting failure data. The data is then supplied through the control box 12 to the mounting failure data edit controller 44 together with a code signal generated from the code reader 34 when it reads the code mark 16 of the substrate 14.

The misregistration checker 22 is adapted to generate mounting failure data when it detects the mounting failure of the electronic parts as described above, and the data is supplied through the control box 40 to the edit controller 44 together with a code signal generated from the code reader 36 when it reads the code mark 16 of the substrate 14.

The mounting failure data edit controller 44 integrates the mounting failure data supplied from the control boxes 12 and 40 with the code signals from the code readers 34 and 36, to thereby carry out the editing and storing of the data.

The code reader 38 of the classifying mechanism 26 serves to read the code mark 16 of each of the substrates 14 successively fed to the mechanism 26 to confirm or collate whether the read code mark of the substrate coincides with any one of code marks stored in the the edit controller 44 together with the mounting failure data as described above, in cooperation with the edit controller 44 through the control box 42. When the code mark of the substrate 14 fed to the classifying mechanism 26 is confirmed to coincide with any one of the codes stored in the edit controller 44, the defective substrates are separated from nondefective substrates and put on the defective substrate conveyor 30 to be delivered to a mounting failure correcting station described hereinafter. When the code mark of the substrate read by the code reader 38 is not present in the codes stored in the edit controller 44, the substrate is transferred to the nondefective substrate conveyor 32 and delivered forwardly. Thus, it will be noted that the classifying mechanism 26 reads the code mark 16 of each of the substrates 14 by means of the code reader 38, to thereby automatically separate defective substrates from nondefective substrates and carry them to a correcting station or mechanism.

The mounting failure detecting and correcting system of the illustrated embodiment further includes a correcting mechanism 46 for correcting the mounting failure of the defective substrate fed thereto by means of the defective substrate conveyor 30. The mounting failure correcting mechanism 46 includes a failure indicator 48 for indicating details of the mounting failure, which has a code reader 50 incorporated therein. The failure indicator 48 is connected to the edit controller 44 so that it may carry out the confirmation or collating of the code mark of the defective substrate in cooperation with the edit controller in a manner similar to the classifying mechanism 26. More particularly, when the defective substrate is delivered to the correcting mechanism 46, the code reader 50 reads the code mark of the substrate and calls the mounting failure data corresponding to the code from the edit controller 44, so that the failure indicator 48 displays or indicates the details of the mounting failure data. Then, an operator corrects the failure in mounting of a chip on the substrate on the basis of the details indicated by the indicator. Thus, it will be noted that the correction of the mounting failure of the defective substrate can be efficiently accomplished. The corrected substrate is then fed through a conveyor 52 to he nondefective substrate conveyor 32.

Thus, it will be noted that the mounting failure detecting and correcting system of the illustrated embodiment can automatically accomplish the classification of defective substrates from acceptable ones and carry out the correction of the defective substrates on the basis of the details of the failure indicated, to thereby provide a manufacturing line which is capable of mounting electronic parts on a substrate with high efficiency and precision.

The mounting failure detecting and correcting system of the embodiment described above may be modified as shown in FIG. 3.

Figure 3:
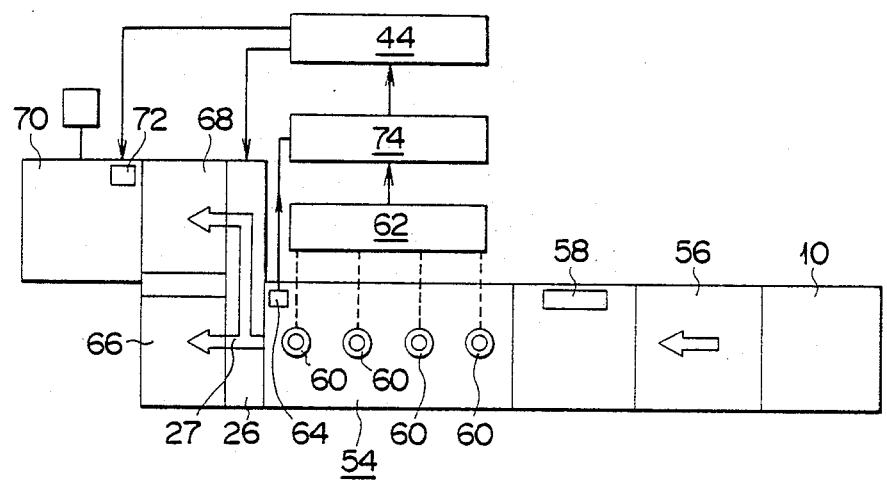
FIG. 3 is a circuit block diagram and a product flow diagram showing a modification of the embodiment shown in FIG. 1.
Figure 4:
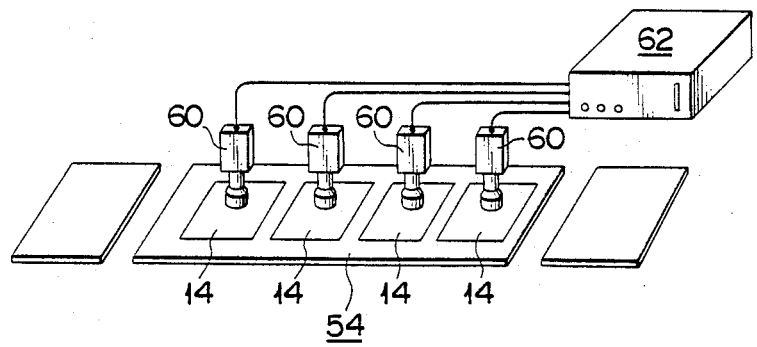
FIG. 4 is a perspective view showing a checking section incorporated in the modification shown in FIG. 3 to detect a failure in the mounting of electronic parts on substrates.

A mounting failure detecting and correcting system shown in FIG. 3 is so constructed that substrates on which electronic parts have been mounted by a chip mounting apparatus 10 are received in a magazine (not shown) and then fed to a subsequent X-Y table 54 by means of a loader 56, during which a bar code labeler 58 applies a bar code to a surface of each of the substrates. The X-Y table 54, as shown in FIG. 4, is adapted to allow a plurality of substrates 14 to be arranged thereon in rows or side by side at predetermined intervals, and checking cameras 60 corresponding in number to the substrates 14 are stationarily arranged above the positions of the X-Y table 54 on which the substrates 14 are disposed. The cameras 60 are adapted to successively supply images of electronic parts on the substrates 14 to a common vision checker 62, which is adapted to detect any mounting failure such as default of the mounting, misregistration of mounted chips with respect to the substrates, a mistake of the mounting direction, mounting of incorrect electronic parts on the substrates and the like.

Also, the X-Y table 54 is provided with a code reader 64, which serves to read the code mark of each of the substrates 14 and feed a code signal concerning the code mark to a data edit controller 44 in a manner to correlate it with mounting failure data of the substrate detected and generated by the vision checker 62, as described in greater detail hereinafter.

The modification shown in FIG. 3 also includes a classifying mechanism 26 arranged forwardly of the X-Y table 54 and connected to the data edit controller 44. The classifying mechanism 26 includes a dogleg-shaped separating conveyor 27. The dogleg-shaped separating conveyor 27 is adapted to classify chip mounting failed or defective substrates from acceptable or nondefective substrates on the basis of the mounting failure data detected by the vision checker 62. In the modification shown in FIG. 3, the classifying mechanism 26 also includes a nondefective substrate unloader 66 and a defective substrate unloader 68 which are connected to the dogleg-shaped conveyor 27 in a manner to be arranged side by side and adapted to forwardly deliver nondefective substrates and defective substrates fed thereto from the conveyor 27, respectively. The defective substrate unloader 68 is connected to a chip locator 70 which is adapted to carry out the correction of each of the defective substrates on the basis of the collating between a code mark thereof read by a code reader 72 provided on the chip locator 70 and the data stored in the edit controller 44.

As described above, in the modification shown in FIG. 3, a plurality of the checking cameras 60 concurrently check a plurality of the substrates 14 positioned on the X-Y table 54 as shown in FIG. 4. At this time, the same points on the respective substrates are moved in the same manner in a relationship to the corresponding checking cameras as the substrates are moved longitudinally or laterally by the X-Y table 54, because like electronic parts are arranged on like positions of the respective substrates. Thus, data about the mounting of electronic parts on the substrates obtained from the same points may be fed from the vision checker 62 to the data edit controller in a manner to correlate with code mark data of the respective substrates read by the code reader 64. More particularly, the vision checker 62 successively receives such first-hand data from the cameras 60 to judge whether the respective substrates are acceptable or defective, and supplies a signal or data of such judgement of each substrate through an NC device 74 to the data edit controller 44, which stores the signals or data therein. The data edit controller 44 is connected to the dogleg conveyor 27 and chip locator 70, so that the data fed from the controller 44 to the dogleg-shaped conveyor 27 and chip locator 70 cause the conveyor 27 to carry out the classification between defective electronic parts and nondefective electronic parts and the locator 70 to correct the defective substrates, respectively. Incidentally, the chip locator 70 may indicate by a spotlight a defective portion with respect to a substrate on which the occurence of the chip mounting failure is detected by the vision checker 62, and take out a suitable chip from a chip feeding unit (not shown) according to the spotlight indication and exchange the defective chip for it.

Thus, it will be noted that the modification shown in FIG. 3 enables a plurality of substrates to be simultaneously subjected to a checking or detecting treatment and successively fed to the subsequent steps, so that the detecting and correcting of defective substrates may be efficiently accomplished for a short period of time.

Figure 5:
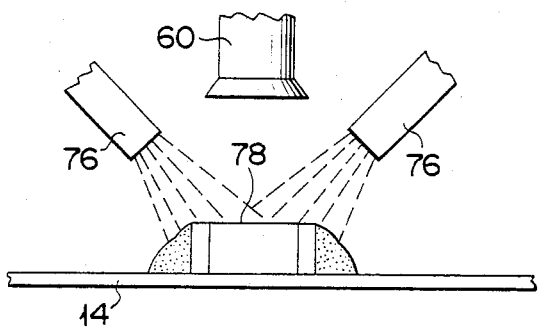
FIG. 5 is a schematic view showing an example of a checking camera adapted to be used in the checking section shown in FIG. 4.

In the modification described above, each of the checking cameras 60, as shown in FIG. 5, may be used in a manner to obtain an image of a chip 78 together with a shade formed at a peripheral edge of the chip 78 mounted on a substrate 14 due to the irradiation of light from stroboscopes 76 positioned above the chip 78, which image with the shade is projected on a frame of the vision checker 62 (FIGS. 3 and 4). In the vision checker 62, the contrast between light and shade in the image of the chip and the shade is partially demarcated at a plurality of points, so that a contour of the chip 78 may be partially determined on the basis of the contrast between light and shade in the image with the shade. Thus, the propriety of mounting of the chip on the substrate may be judged depending upon whether each of the obtain partial contour of the chip 78 is projected at a predetermined position on the frame of the vision checker 62. In this instance, the partial demarcation of the contrast may be carried out by using windows which are provided in a frame of the vision checker 62 to limit the demarcated regions to a plurality of positions predetermined in the image of the chip and the shade observed through the camera 60 and along a periphery of the chip image and the shade. The use of such windows allows the positional relationship between the substrate and the chip to be obtained on the basis of the difference in contrast between the image of the chip and the shade on a portion of the substrate about the chip, or between images of electrode terminals of the chip and a shade on a portion of the substrate about the terminals.

Figure 6:
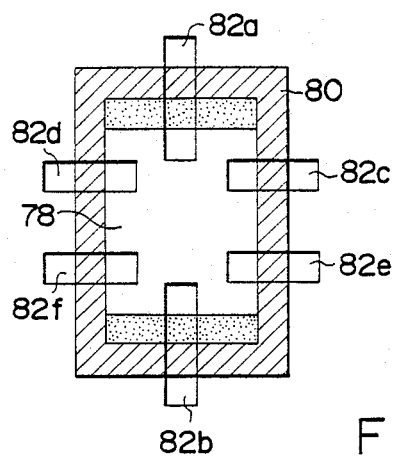
FIGS. 6 to 8 each are a schematic view of assistance in explaining a manner of judging the propriety of mounting of electronic parts on a substrate.

Supposing that a rectangular chip 78 is mounted on a substrate as shown in FIG. 6, the irradiation of light from the stroboscopes 76 (FIG. 5) onto the chip causes a shade 80 to be formed about the chip. A frame of the vision checker 62 (FIGS. 3 and 4) on which an image of the chip 78 together with the shade 80 is projected is provided with windows 82a to 82f each of which partially limits the image with the shade in both the longitudinal and lateral directions along a desired position at which the chip is mounted on the substrate, so that the image with the shade observed through the camera 60 (FIG. 5) may be superposed on the frame and the contrast between light and shade in the image with the shade may be scanned to detect the border between the image of the chip and the shade. Such detection is carried out at the respective windows 82a to 82f to determine a contour of the chip 78, and a failure in the mounting of the chip 78 on the substrate is judged when the contour is deflected over a position predetermined within the respective windows 82a to 82f.

Figure 7:
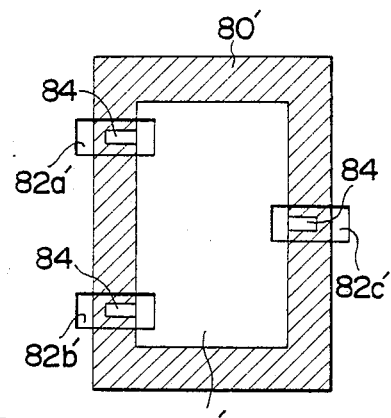

When a chip to be mounted on a substrate is a transistor 78' having electrodes 84 projected therefrom as shown in FIG. 7, a frame of the vision checker which is provided with windows 82a' to 82c' at positions corresponding to the electrodes is used. A failure in the mounting of the chip 78' on the substrate is judged by counting the ratio between a shade 80' formed about the chip and positioned in each of the windows 82a' to 82c' and light reflected from each of the electrodes 84 due to the irradiation of light from the stroboscopes 76, as the number of picture cells.

Figure 8:
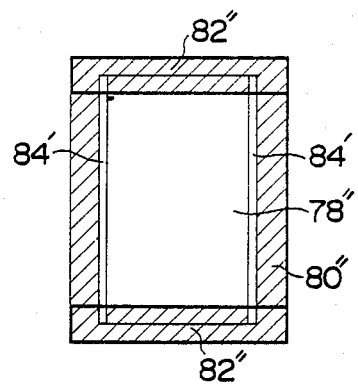

Further, when a chip is a cylinder-type chip resistor 78" as shown in FIG. 8, electrodes 84' of the chip 78" glisten due to the reflection of light from the stroboscopes 76 (FIG. 5) in a shade 80" formed about the chip 78", so that the chip mounting may be judged on the basis of a correlation between edges of windows 82" of a frame of the vision checker and glistening edge portions of the chip 78". More particularly, in the checking, the propriety of mounting of the chip on a substrate is determined, when the edge of the chip 78" can be detected by each of the windows 82" and the edge of the chip is not superposed on those of the windows 82", whereas the improper mounting is determined when at least one of both side edges of the chip 78" is superposed on the edges of the windows 82" or any edge of the chip can not be detected in the windows 82". Also, default of the mounting is determined when the irradiation of light does not cause any shade to occur.

Accordingly, it will be noted that, in the modification described above, the propriety of the mounting is judged utilizing the contrast of an image of a chip with a shade formed due to the irradiation of light onto the chip, so that the judgement may be precisely and quite readily accomplished with respect to a chip of any shape.

It will thus be seen that the objects set forth above, among those made apparent from the preceding description, are efficiently attained and, since certain changes may be made in the construction set forth and carrying out the above method, without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as matter of language, might be said to fall therebetween.

What is claimed is:

1. A method of detecting a failure in the mounting of electronic parts on substrates, comprising the steps of:
    applying a different code mark, to a surface of each substrate on which electronic parts are to be mounted;
    detecting a failure in the mounting of said electronic parts on each of said substrates after the mounting by checking for at least one of proper electrical functioning of said parts and proper physical positioning of said parts relative to each of said substrates;
    reading the code mark of each substrate for which a failure is detected thereby identifying failed substrates;
    classifying said failed substrates from acceptable substrates and transferring said failed substrates to a station for correction of the failures.

2. A method as defined in claim 1, wherein said code mark is formed by applying a bar code.

3. A method as defined in claim 1, including returning said failed substrates to a conveyor for said acceptable substrates after a failure correcting operation.

4. A method of detecting a failure in the mounting of electronic parts on substrates, comprising the steps of:
    applying a different code mark, to a surface of each substrate on which electronic parts are to be mounted;
    detecting a failure in the mounting of said electronic parts on each of said substrates after the mounting by checking for at least one of proper electrical functioning of said parts and proper physical positioning of said parts relative to each of said substrates;
    reading the code mark of each substrate for which a failure is detected thereby identifying failed substrates, and storing code mark data of the corresponding failed substrates together with detected mounting failure data;
    classifying said failed substrates from acceptable substrates and transferring said failed substrates to a correcting station on the basis of said stored code mark data and mounting failure data; and
    indicating details of mounting failure of each of said failed substrates to facilitate correction of each failed substrate at said correcting station.

5. A method as defined in claim 4, wherein said code mark is formed by applying a bar code.

6. A method as defined in claim 4, including returning said failed substrates to a conveyor for said acceptable substrates after a failure correcting operation.

7. An apparatus for detecting a failure in the mounting of electronic parts on substrates, comprising:
    a characteristic checker for detecting substrates on which electronic parts having characteristics other than predetermined ones are mounted, to identify failed substrates;
    a misregistration checker for detecting a default in the parts mounting, the positional deflection of the mounted electronic parts with respect to each of said substrates, and an error in the mounting direction;
    a separating conveyor for carrying out a classification between the failed substrates and acceptable substrates;
    a failure indicator for indicating details of a failure of each of said failed substrates to facilitate correction of each failed substrate;
    a code reader incorporated in each of said characteristic checker, misregistration checker, separating conveyor and failure indicator to read a code mark attached to each of said substrates;
    control boxes connected to said characteristic checker, misregistration checker and separating conveyor, respectively;
    a mounting failure data edit controller connected through said control boxes to said characteristic checker, misregistration checker and separating conveyor, respectively, and further connected to said failure indicator;

said mounting failure data edit controller including means for editing and storing mounting failure data of the failed substrates as supplied from said respective checkers through the corresponding control boxes together with code mark data of the corresponding failed substrates as read by the corresponding code reader of each of said characteristic checker and misregistration checker;

said mounting failure data edit controller also including means for carrying out collating between said code mark data stored therein and code mark data read by said code reader of said separating conveyor to identify said failed substrates, so that said separating conveyor is enabled to carry out its classification operation;

said failure indicator selectively calling said mounting failure data stored in said mounting failure data edit controller therefrom depending upon the code mark of each of said failed substrates as read by said code reader of said failure indicator to indicate details of the called mounting failure data.

8. A method of detecting a failure in the mounting condition of electronic parts on substrates, comprising the steps of:

attaching a different code mark to each of the substrates;

arranging in rows a plurality of substrates each having electronic parts mounted thereon;

observing images of said electronic parts as mounted on the substrates;

successively checking said images of said electronic parts and producing check data indicative of the mounting condition of the parts on said substrate;

processing and storing said check data together with the code marks attached to said substrates;

identifying failed substrates on the basis of the stored check data and code marks; and carrying out correction of failed substrates on the basis of said stored data.

9. An apparatus for detecting a failure in the mounting condition of electronic parts on substrates, comprising:

an X-Y table for arranging in rows a plurality of substrates each having electronic parts mounted thereon and a different identifying code mark;

a plurality of checking cameras arranged above said X-Y table at positions corresponding to the positions at which said substrates are arranged;

a vision checker for successively checking images supplied from said checking cameras to generate check data indicative of the mounting condition of the part on the substrates; and data edit controller means for processing and storing check data together with the code marks attached to each of said substrates to enable correction of failed substrates on the basis of said data stored therein, including means for identifying the failed substrates on the basis of the stored check data and code marks.

10. A method of detecting a failure in the mounting condition of electronic parts on substrates, comprising the steps of:

irradiating light to a substrate having electronic parts mounted thereon in a downward direction to form a shade region on the substrate about said electronic parts;

partially demarcating an image of said electronic parts with said shade at a plurality of points along the peripheries of said electronic parts; and observing the contrast of the partially demarcated image with said shade to detect a failure in the mounting condition of said electronic parts on said substrate.

* * * * *